(12) United States Patent
Sridharan et al.

(10) Patent No.: US 11,362,047 B2
(45) Date of Patent: Jun. 14, 2022

(54) INTEGRATED SYSTEM-IN-PACKAGE WITH RADIATION SHIELDING

(71) Applicant: Texas Instruments Incorporated, Dallas, TX (US)

(72) Inventors: Vivek Swaminathan Sridharan, Dallas, TX (US); Yiqi Tang, Allen, TX (US); Christopher Daniel Manack, Flower Mound, TX (US); Rajen Manicon Murugan, Dallas, TX (US); Liang Wan, Chengdu (CN); Hiep Xuan Nguyen, Cedar Hill, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/850,620

(22) Filed: Apr. 16, 2020

(65) Prior Publication Data

US 2021/0327829 A1    Oct. 21, 2021

(51) Int. Cl.
*H01L 23/60* (2006.01)
*H01L 23/495* (2006.01)
*H01L 23/00* (2006.01)
*H01L 33/00* (2010.01)
(Continued)

(52) U.S. Cl.
CPC .......... *H01L 23/60* (2013.01); *H01L 23/4952* (2013.01); *H01L 23/49503* (2013.01); *H01L 23/49575* (2013.01); *H01L 24/28* (2013.01); *H01L 24/82* (2013.01); *H01L 33/005* (2013.01); *H01L 33/62* (2013.01);
(Continued)

(58) Field of Classification Search
CPC . H01L 23/60; H01L 23/49503; H01L 33/005; H01L 24/28; H01L 24/82; H01L 23/4952; H01L 23/49575; H01L 33/62; H01L 2933/0066; H01L 2933/005; H01L 24/25; H01L 21/6835
See application file for complete search history.

(56) References Cited

U.S. PATENT DOCUMENTS

| 2012/0025704 A1* | 2/2012 | Onobuchi | ............. H01L 25/167 315/32 |
| 2015/0042694 A1* | 2/2015 | Lee | ...................... G09G 3/3225 345/690 |

(Continued)

FOREIGN PATENT DOCUMENTS

WO    2013032728    3/2013

*Primary Examiner* — Patricia D Valenzuela
(74) *Attorney, Agent, or Firm* — Ronald O. Neerings; Charles A. Brill; Frank D. Cimino

(57) ABSTRACT

A system in a package (SIP) includes carrier layer regions that have a dielectric material with a metal post therethrough, where adjacent carrier layer regions define a gap. A driver IC die is positioned in the gap having nodes connected to bond pads exposed by openings in a top side of a first passivation layer, with the bond pads facing up. A dielectric layer is on the first passivation layer and carrier layer region that includes filled through vias coupled to the bond pads and to the metal post. A light blocking layer is on sidewalls and a bottom of the substrate. A first device includes a light emitter that has first bondable features. The light blocking layer can block at least 90% of incident light. The first bondable features are flipchip mounted to a first portion of the bond pads.

20 Claims, 13 Drawing Sheets

(51) Int. Cl.
*H01L 33/62* (2010.01)
*H01L 21/683* (2006.01)

(52) U.S. Cl.
CPC .......... *H01L 21/6835* (2013.01); *H01L 24/25* (2013.01); *H01L 2933/005* (2013.01); *H01L 2933/0066* (2013.01)

(56) References Cited

U.S. PATENT DOCUMENTS

| | | |
|---|---|---|
| 2016/0111403 A1* | 4/2016 | Yap .................. H01L 23/49548 257/676 |
| 2017/0025361 A1 | 1/2017 | Lee et al. |
| 2018/0019290 A1* | 1/2018 | Arai ....................... C08G 73/10 |
| 2018/0090532 A1* | 3/2018 | Borthakur ........... H01L 27/1462 |
| 2018/0165396 A1 | 6/2018 | Lin et al. |
| 2019/0004573 A1* | 1/2019 | Kulkarni ............... H01L 23/473 |
| 2019/0096864 A1* | 3/2019 | Huitema ................. H01L 24/82 |
| 2019/0393130 A1 | 12/2019 | Mahnkopf et al. |

\* cited by examiner

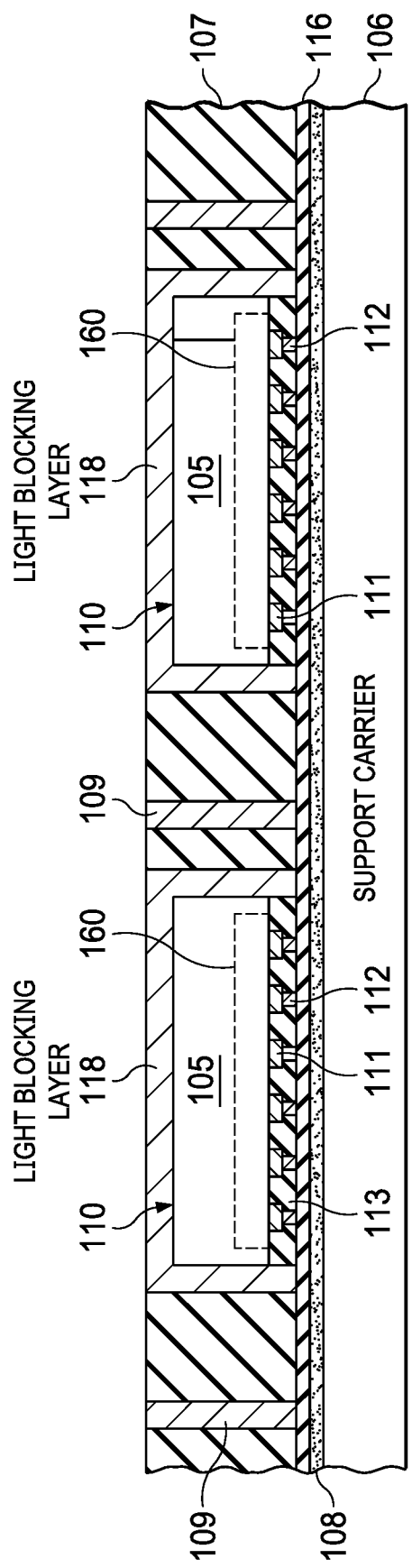
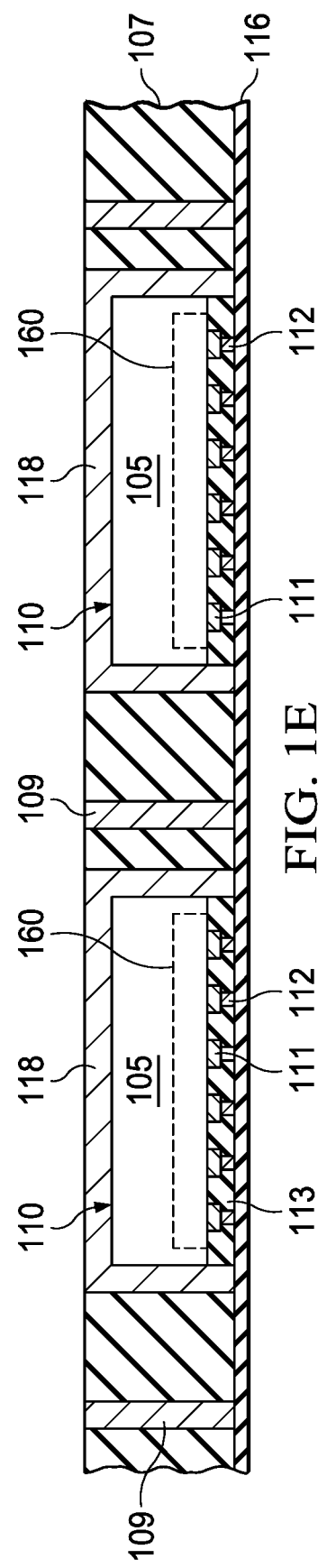
FIG. 1D
FIG. 1E

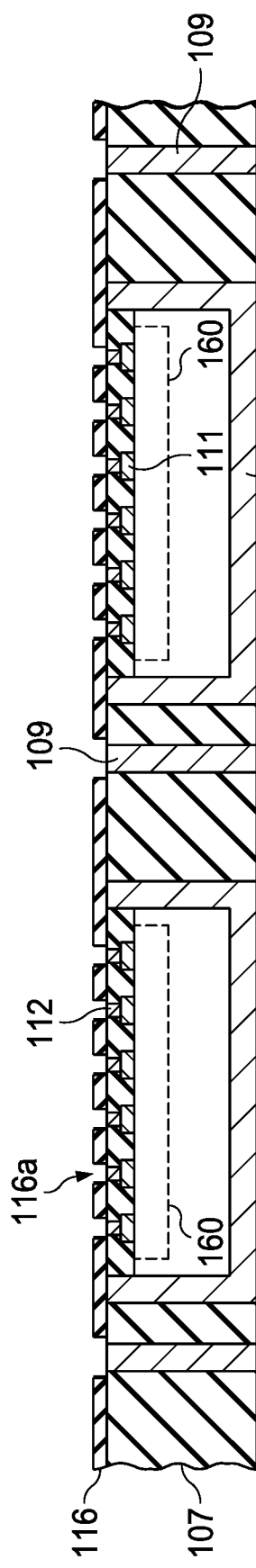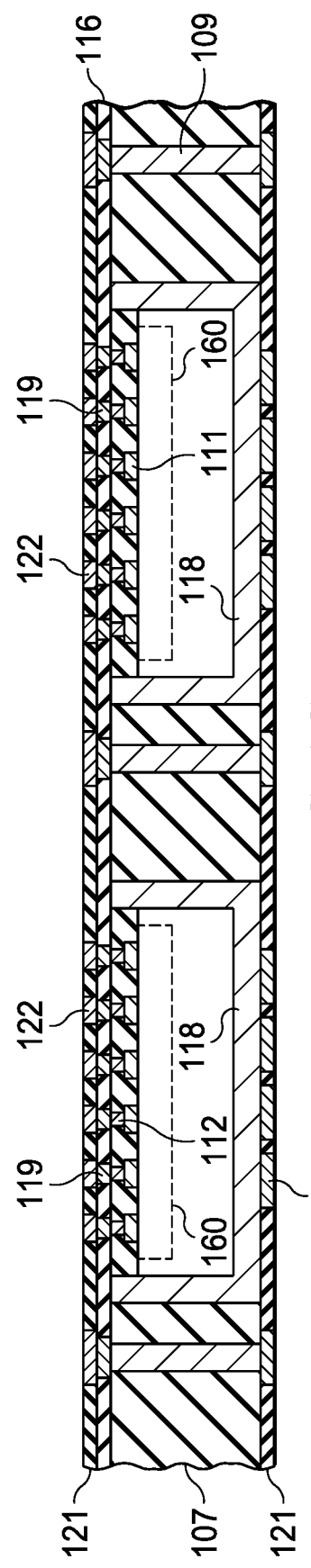

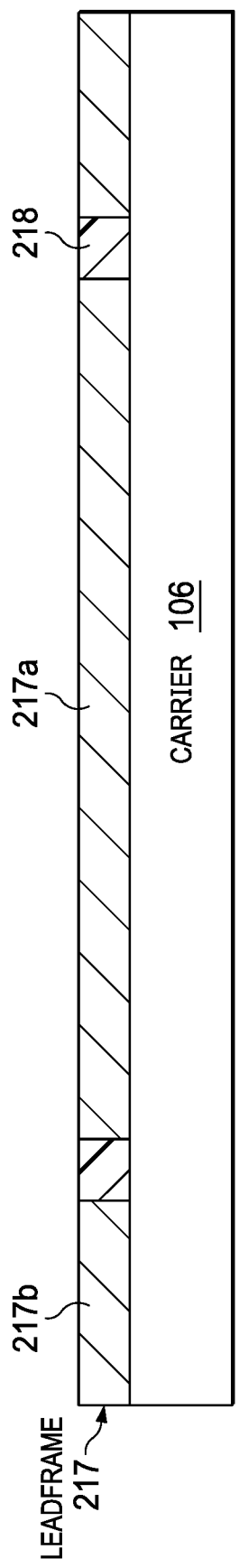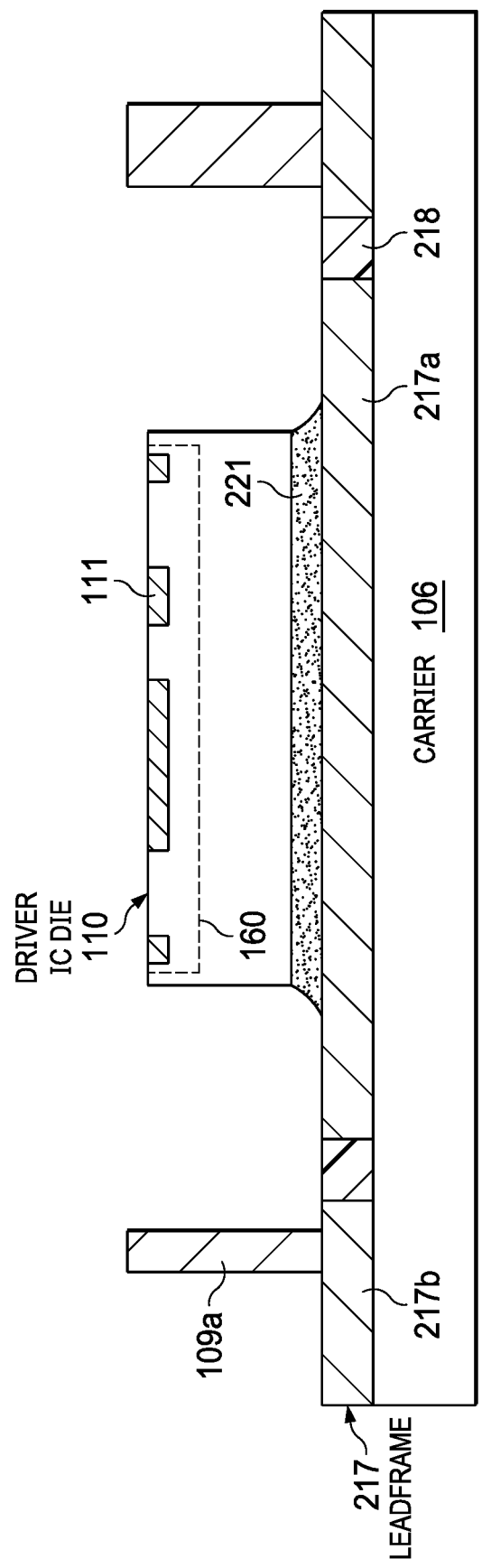

US 11,362,047 B2

INTEGRATED SYSTEM-IN-PACKAGE WITH RADIATION SHIELDING

FIELD

This Disclosure relates to System-in-Packages (SIPs).

BACKGROUND

Some SIPs comprise a driver integrated circuit (IC) and one or more other devices. The driver IC includes some digital circuitry generally including signal processing and logic, and analog circuitry for the actual driver function. For example, a metal oxide semiconductor field effect transistor (MOSFET) driver takes low-level digital signals received from a processor or a controller and delivers at its output signals with a different voltage and current. SIP devices may include light-emitting devices, such as light-emitting diodes (LEDs) or semiconductor lasers typically being vertically emitting lasers, as well as other devices such as passives including inductors or capacitors.

Known solutions for such SIPs mount a packaged driver IC die, specialty chip(s) such as light-emitting devices, and passive device(s), all lateral to one another on a customer's printed circuit board (PCB). For example, some known SIP arrangements place a packaged driver IC and a light-emitting device side-by-side on a PCB as close as possible, and shield the package driver IC from the light-emitting device's emissions using an organic encapsulant for light blocking and a metallic encapsulant for minimizing electromagnetic interference (EMI). An organic encapsulant for light blocking can comprise a mold compound. A metallic encapsulant for minimizing EMI can comprise a metal layer that can be sputtered onto the mold compound.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes area constrained PCBs as well as high-speed applications can benefit from a SIP comprising a device A comprising a driver IC die, a device B which is a light-emitting device that can also be EMI generating, and optionally also a device C which may be a passive device, such as an inductor, capacitor, or a resistor. Device B and device C are stacked side-by-side, both on device A, while meeting several needs. One need is immunity of device A from light or EMI received from device B, and possibly also light or EMI received from device C. Another need is to have the shortest interconnect length between device A and device B, and between device A and device C when device C is optionally included, to minimize the inductance (and resistance) of the device-to-device interconnects. Another need is a low thermal resistance of device B and device C to the ambient ($\theta_{JA}$), which can be impeded by device A's heating. It is recognized that immunity to light and EMI/thermal performance, and proximity/size of the SIP, are generally conflicting needs.

Despite these conflicting needs, this Disclosure describes SIPs that generally provide all the above-described needs comprising a 3-dimensional (3D) device arrangement comprising device A, with device B on device A, and optionally also device C on device A. Disclosed SIPs thus comprise a device A that is a driver IC die, device B that is a light-emitting device which may also be EMI generating, and optionally another device C. Disclosed SIPs include a light blocking layer on top of device A which provides it immunity from light and/or EMI emanating from device B, and also emanating from device C when it is optionally also provided, from reaching device A. Although device A comprises a driver IC die, device B and device C may each be in IC die form, or may also each be packaged devices generally in any form, such as provided as a leaded package or a leadless package.

Disclosed aspects include a SIP that includes carrier layers region that comprises a dielectric material, with at least one metal post extending through its thickness, where adjacent carrier layer regions define a gap. A driver IC die including a substrate is positioned in the gap having nodes connected to bond pads that are exposed by openings in a top side of a first passivation layer, with the bond pads facing up. A dielectric layer is on the first passivation layer and the carrier layer regions that includes filled through vias for coupling to the bond pads and to the metal post. A light blocking layer is on sidewalls and on a bottom of the substrate. A first device that includes a light emitter has first bondable features. The light blocking layer can block at least 90% of incident light received from light emitter. The first bondable features are flipchip mounted with a solder connection to a first portion of the bond pads.

BRIEF DESCRIPTION OF THE DRAWINGS

Reference will now be made to the accompanying drawings, which are not necessarily drawn to scale, wherein:

FIGS. 1A-1I show successive cross-sectional views corresponding to an example method for forming a disclosed SIP. FIG. 1A shows the results after applying a tacky tape onto a support carrier. FIG. 1B shows the results after applying a dielectric layer that can be a light blocking layer on top of the tacky tape. FIG. 1C shows the results after forming on the dielectric layer a plurality of carrier layer regions each having at least one metal post therethrough, and placing driver IC die in the gaps between the carrier layer regions. FIG. 1D shows the results after forming a light blocking layer in the gaps between carrier layer regions and the driver IC die. FIG. 1E shows results after debonding the sheet of in-process SIP devices from the support carrier. FIG. 1F shows the results after flipping the sheet of in-process SIP devices and then forming vias in the dielectric layer. FIG. 1G shows results for the sheet of in-process SIP devices after applying a light blocking passivation layer that includes metal features through both sides of the sheet of the light blocking passivation layer, then patterning both sides of the sheet. FIG. 1H shows results for the sheet of in-process SIP devices after forming solder balls over the metal features on both sides of the sheet. FIG. 1I shows results after singulating the sheet of in-process SIP devices to provide a plurality of SIP devices.

FIGS. 2A-2E show successive cross-sectional views corresponding to an example method for forming a disclosed SIP. FIG. 2A shows a pre-molded leadframe comprising leadframe metal including a die pad and a plurality of leads or lead terminals, where the die pad and the leads or lead terminals are separated by a mold compound. FIG. 2B shows the in-process SIP after die attaching a driver IC die top side up using a die attachment material, and after plating to form metal posts (for example, comprising copper) onto the leads or lead terminals on respective sides of the driver IC die. FIG. 2C shows the in-process SIP after over molding to form a mold compound, and then backgrinding the mold compound to a desired final thickness. FIG. 2D shows the in-process SIP after drilling to form apertures through a thickness of the mold compound over the top side of the driver IC die, and after the drilling forming metal in the apertures depicted in areas shown over bond pads of driver IC die to provide the bonding features shown. FIG. 2E shows the in-process SIP after plating a patterned redistribution layer (RDL) using a patterned dielectric layer to contact the bonding features and to contact the top side of the metal posts.

DETAILED DESCRIPTION

Figure 1A:
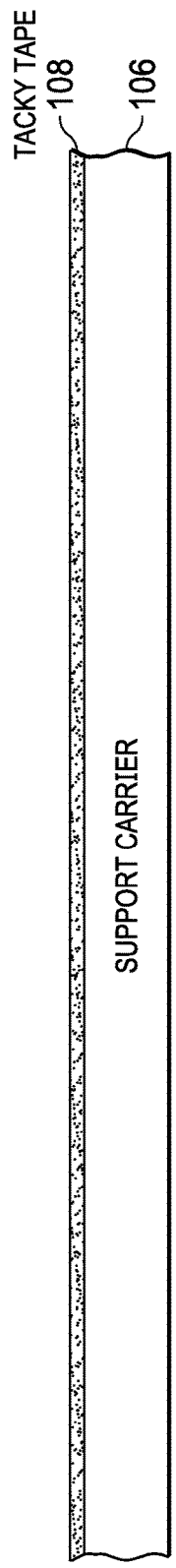

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 1B:
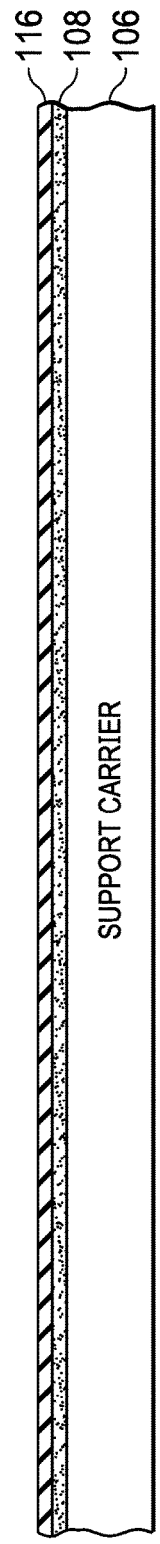
Figure 1C:
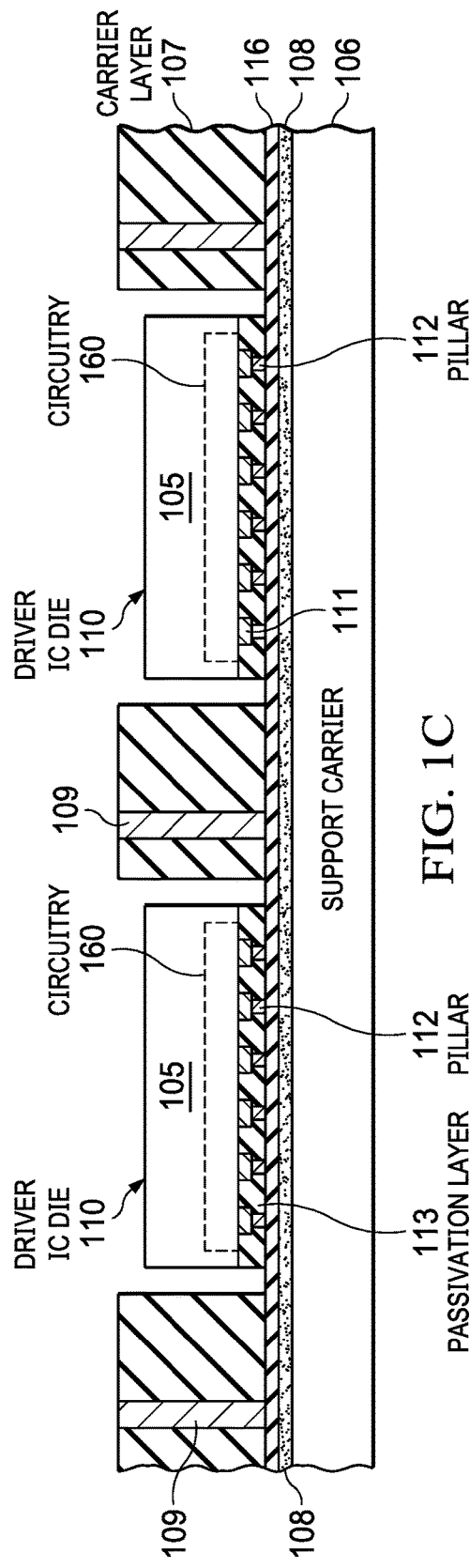
Figure 1H:
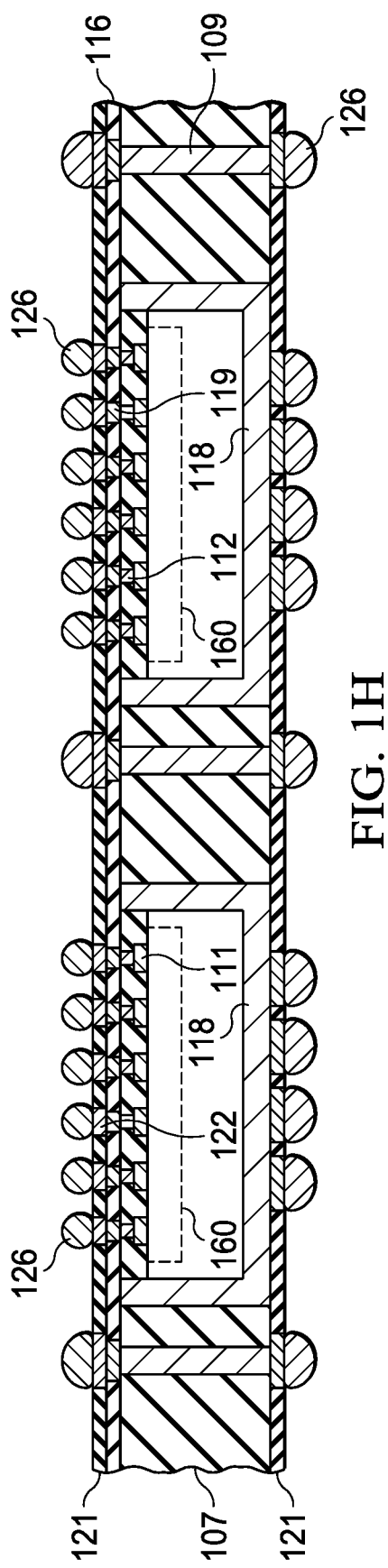
Figure 1I:
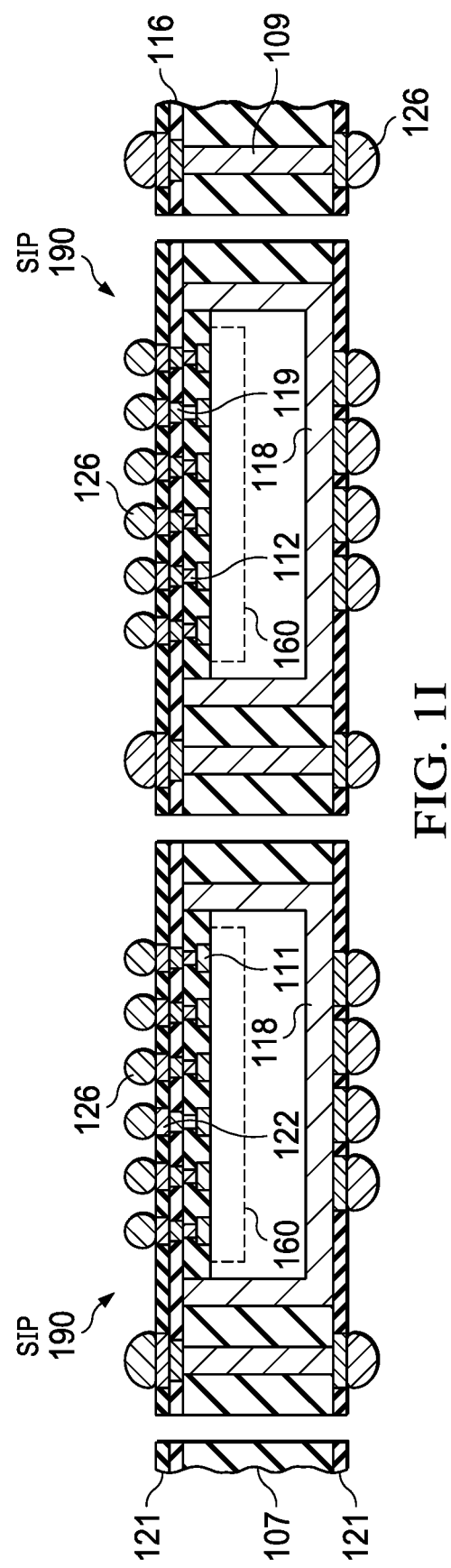
Figure 1J:
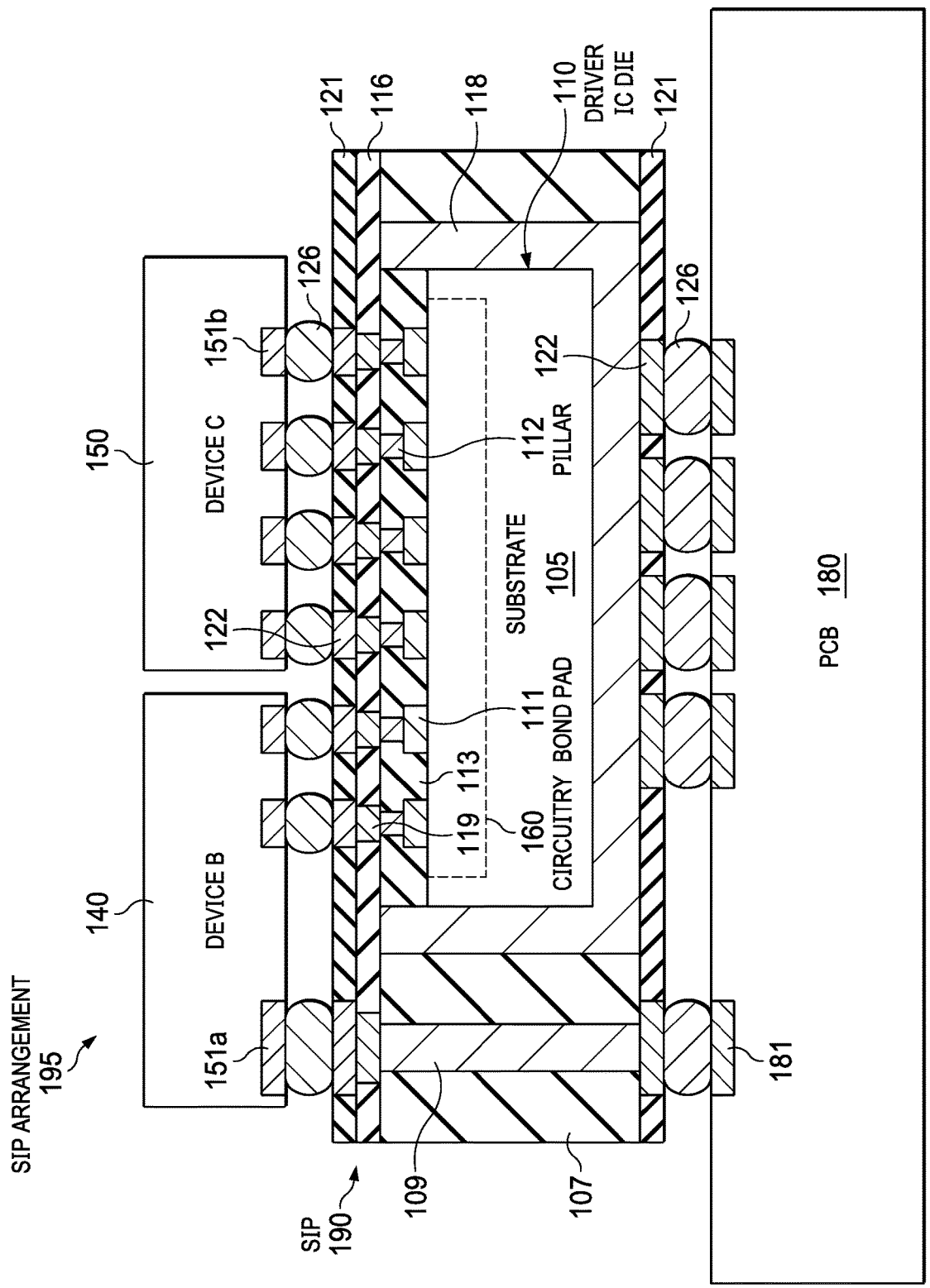
FIG. 1J shows the results after assembling one of the SIPs shown in FIG. 1I after being singulated to a PCB.

FIGS. 1A-1I show successive cross-sectional views corresponding to an example method for forming a disclosed SIP, and FIG. 1J shows the results after assembling one of the SIPs shown in FIG. 1I as 190 after being singulated from a sheet of SIP devices to a PCB 180, according to an example aspect. FIG. 1A shows the results after applying a tacky tape 108 onto a support carrier 106. The tacky tape 108 generally comprises a double-sided sticky tape, that can comprise a thermal tape or a light release tape. One specific double-sided tape example is a commercially available adhesive product marketed by Brewer Science as a laser release material.

The support carrier 106 can comprise a metal such as copper, or a non-metal substrate such as a PCB, or glass, where the support carrier 106 has an area sufficient to form a two-dimensional (2D) sheet of SIP devices including plurality of SIPs. FIG. 1B shows the results after applying a dielectric layer 116 that can be a light blocking layer on top of the tacky tape 108. The dielectric layer 116 may comprise for example an epoxy including carbon loading, where the loading level is sufficient to be light blocking, such as having a carbon black content of 0.1 to 10%, typically 1 to 10%, at a thickness generally in a range of about 10 μm to 100 μm.

FIG. 1C shows the results after forming on the dielectric layer 116 a plurality of carrier layer regions 107 each having at least one metal post 109 therethrough, and then placing a driver IC die 110 in the gaps between the carrier layer regions 107. The dielectric material for the carrier layer regions 107 can comprise a commercially available dielectric material known as Ajinomoto Build-up Film (ABF) marketed by Ajinomoto Group which is known to be a three-layer polymer system, with a polyethylene terephthalate (PET) support film, a resin layer, and a cover film. The dielectric material for the carrier layer regions 107 can also comprise a prepreg which is known in the art to be a reinforcing fabric which has been pre-impregnated with a resin system, typically being an epoxy resin.

Adjacent ones of the carrier layer regions 107 can be seen to be spaced apart from one another to provide gaps having a size that is larger than the dimensions of driver IC die 110 to enable the driver IC die 110 to be placed within the gaps. Regarding processes for forming the carrier layer regions 107 each having a metal post 109 therethrough, the metal posts 109 can be pre-formed into an un-patterned dielectric material for later becoming the carrier layer regions 107 by first via drilling through the dielectric material, then a seed deposition, then plating (e.g., copper plating), then etching to leave only the metal posts 109 in the vias, and then forming cavities referred to herein as gaps in the dielectric material between adjacent ones of the carrier layer regions 107. The gaps may be formed as using a material removal process, for example comprising laser drilling. This is followed by then placing driver IC die 110 in the gaps.

The driver IC die 110 comprises a substrate 105 such as comprising silicon, that includes bond pads 111 on its top side which are coupled to nodes in its circuitry 160, with pillars 112 generally comprising copper on the bond pads 111. Both the pillars 112 and the bond pads 111 are shown within a passivation layer(s) 113 also referred to herein as a first passivation layer. The driver IC die 110 is placed top side down onto the dielectric layer 116 in the gaps between adjacent carrier layer regions 107.

The circuitry 160 on the driver IC die 110 can comprise circuit elements (including transistors, and generally diodes, resistors, capacitors, etc.), such as formed in a substrate 105 comprising an epitaxial layer on a bulk substrate material, configured together for realizing at least a driver function, and optionally one or more other circuit functions. Example additional circuit functions include a processor, as well as analog (e.g., amplifier or power converter or load switch), radio frequency (RF), digital, or non-volatile memory functions.

FIG. 1D shows the results after forming a light blocking layer 118 that generally provides a high thermal conductivity in the gaps between carrier layer regions 107 and the driver IC die 110. In this process flow, as described below, the light blocking layer 118 also provides a die attachment layer for the driver IC die 110. The light blocking layer 118 can be a sintered Ag (silver) layer, or may comprise solder. The processing to form the light blocking layer 118 can comprise flush molding including filling the gaps between the edge of the carrier layer regions 107 and the driver IC die 110. However, although not shown, there may be some light blocking layer 118 also applied outside these gaps, including being present on the back side of the support carrier 106 of the sheet of in-process SIP devices as well.

FIG. 1E shows results after debonding the sheet of in-process SIP devices from the support carrier 106. Debonding, for example, can be accomplished by laser processing or by a heat release process applied to result in a release by the tacky tape 108. A debonding operation commonly takes place on a commercially available debonder that is conventionally used for forming through silicon vias (TSVs) and for forming fan-out packages. FIG. 1F shows results after flipping the sheet of in-process SIP devices and then forming vias shown as 116a in the dielectric layer 116. For example, the vias 116a can be formed by laser ablation, such as by a $CO_2$ or an ultraviolet (UV) laser that stops on metal shown as the pillars 112 on the bond pads 111 of driver IC die 110. The dimensions of the vias 116a can be seen to be larger as compared to the area dimension of the pillars 112.

FIG. 1G shows results for the sheet of in-process SIP devices after applying a light blocking passivation layer 121 which can comprise a buildup layer sheet that includes metal features 122 through both sides of the sheet of the light blocking passivation layer 121, then patterning both sides of the sheet. The metal features 122 on the top side of the sheet also fill the vias 116a in the dielectric layer 116, with the metal filled vias being shown as 119. Alignment for this purpose is generally performed with respect to the vias 116a, and the light blocking passivation layer 121 formation process may comprise a semi-additive plating process or a subtractive etching process. The metal features 122 include metal features positioned over the metal posts 109 on both sides of the SIPs. FIG. 1H shows results for the sheet of in-process SIP devices after forming solder balls 126 over the metal features 122 on both sides of the sheet.

FIG. 1I shows results after singulating the sheet of in-process SIP devices to provide a plurality of SIP devices, each being shown as SIP 190. Typical singulation processes can be used for this purpose, such as a process comprising mechanical sawing with diamond blades. FIG. 1J shows results shown as SIP arrangement 195 after assembling one of the SIPs 190 onto land pads 181 of a PCB 180, followed by assembling device B 140 and device C 150 lateral to one another onto the solder balls 126 shown on the top side of the driver IC die 110. The driver IC die 110 is shown including its circuitry 160 forming the substrate 105. Device B 140 and device C 150 both include bonding features shown as 151a (referred to as first bondable features) and 151b (referred to as second bondable features), respectively, for contacting the solder balls 126.

Device B 140 can comprise one or more LEDs, a microphone, or a semiconductor laser such as a vertical-cavity surface-emitting laser (VCSEL), which is known to be a type of semiconductor laser diode that provides a laser beam emission oriented perpendicular to the top surface of the device. Device C 150 can comprise a capacitor, such as a surface mounted capacitor, laminate capacitor, trench capacitor (e.g., formed in silicon), inductor, or a MEMS device which can comprise an environmental sensor, where device B 140 and device C 150 can each be soldered as a surface mount (SMT) device.

There is a face-to-face interconnect provided by the SIP arrangement 195 between device B 140 and driver IC die 110 (see the face-to-face interconnect 318 identified in FIG. 3 described below). Disclosed face-to-face interconnects being over short length provide a low inductance, generally 1 to 500 pH, and a low resistance that is generally <1 mOhm up to about 100 mOhm.

Also provided is a low thermal resistance path for the SIP arrangement 195 by including the light blocking layer 118 as a high thermal conductivity die attach material for the driver IC die 110, where the light blocking layer 118 is generally also diffusive. Diffusive is a material property that relates to the thermal conduction to dissipate heat from fast bursts of electrical power, for device B 140 and device C 150 generally dissipating heat with respect to driver IC die 110. The light blocking layer 118 generally provides a 20° C. thermal conductivity of at least 10 W/m·K to provide a thermally conductive path for device B 140 and for device C 150, such as the light blocking layer 118 providing a thermal conductivity of 10 W/m·K to 150 W/m·K.

As described above, device B 140 and device C 150 can each be packaged devices, or can also be IC die. The bonding features 151a and 151b for device B 140 and for device C 150, respectively, can comprise underbump metallurgy that is solder finished, electroless nickel immersion gold (ENIG), electroless nickel immersion palladium immersion gold (ENIPIG), or an organic soldering preservative (OSP).

Figure 2C:
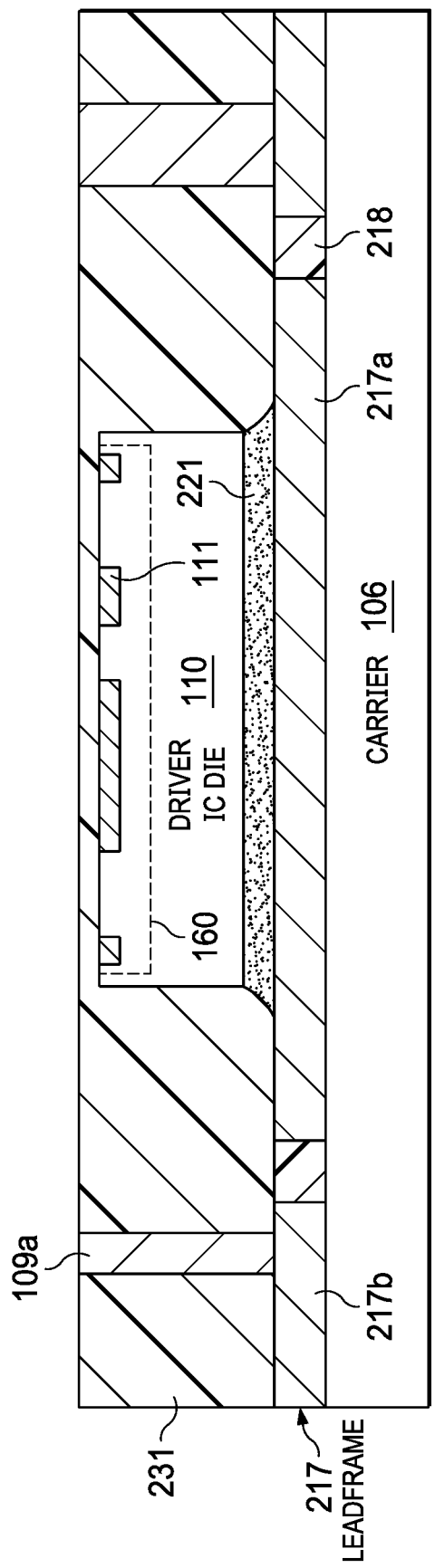
Figure 2D:
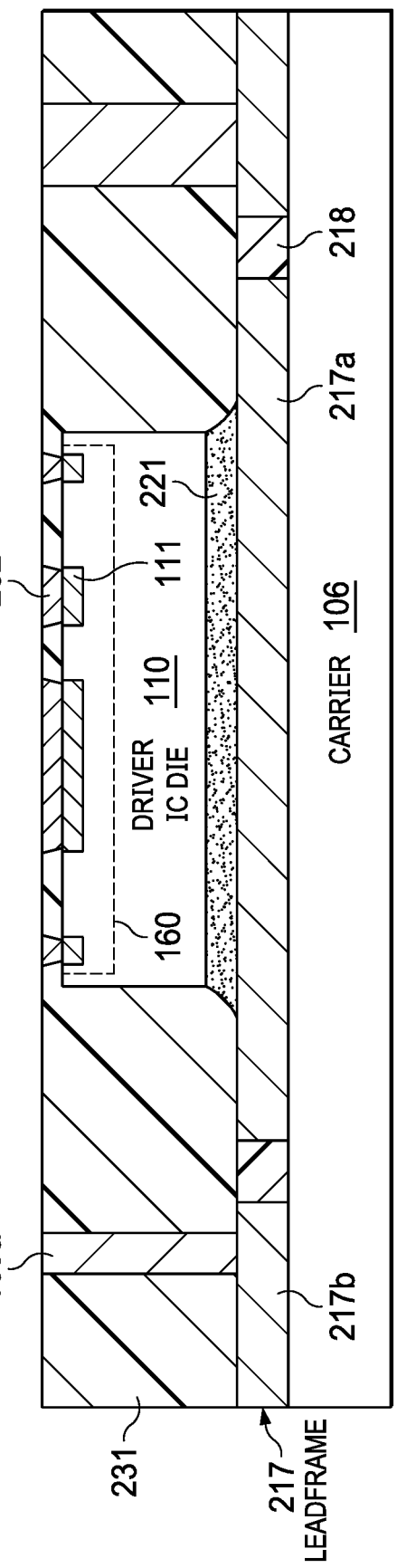
Figure 2E:
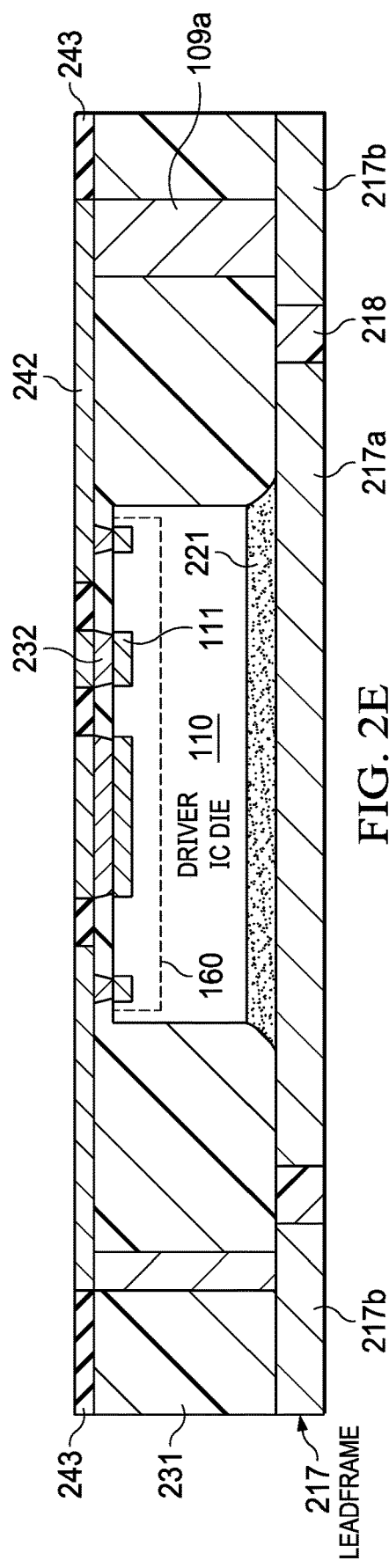
Figure 2F:
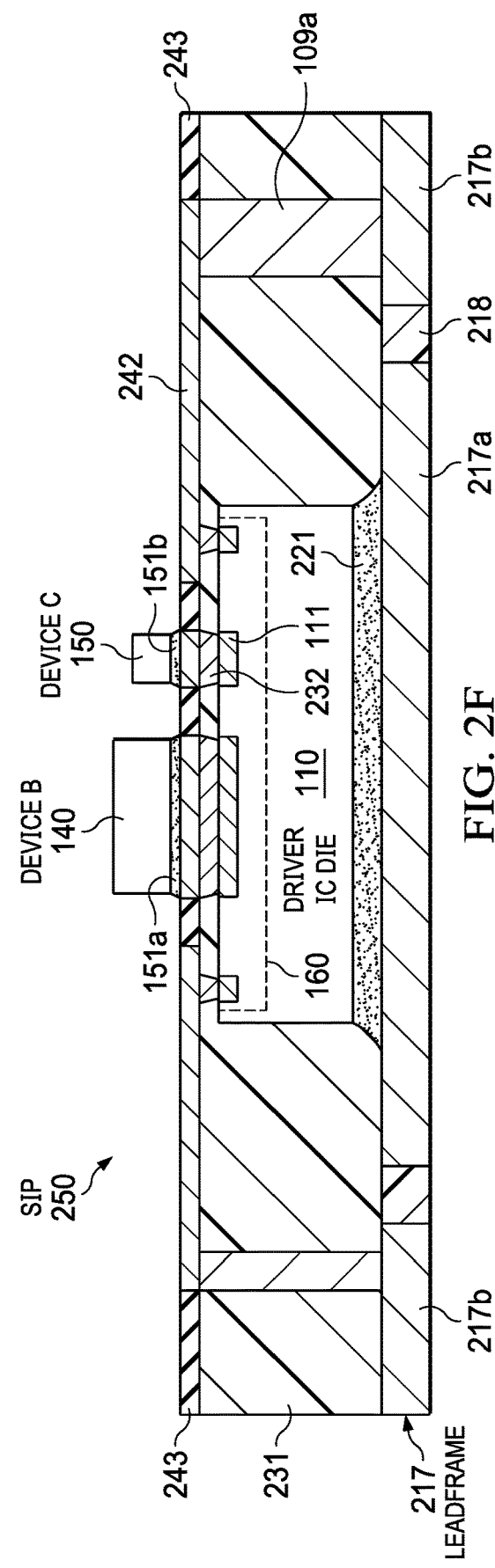
FIG. 2F shows the SIP after attaching a device B and device C.
Figure 2G:
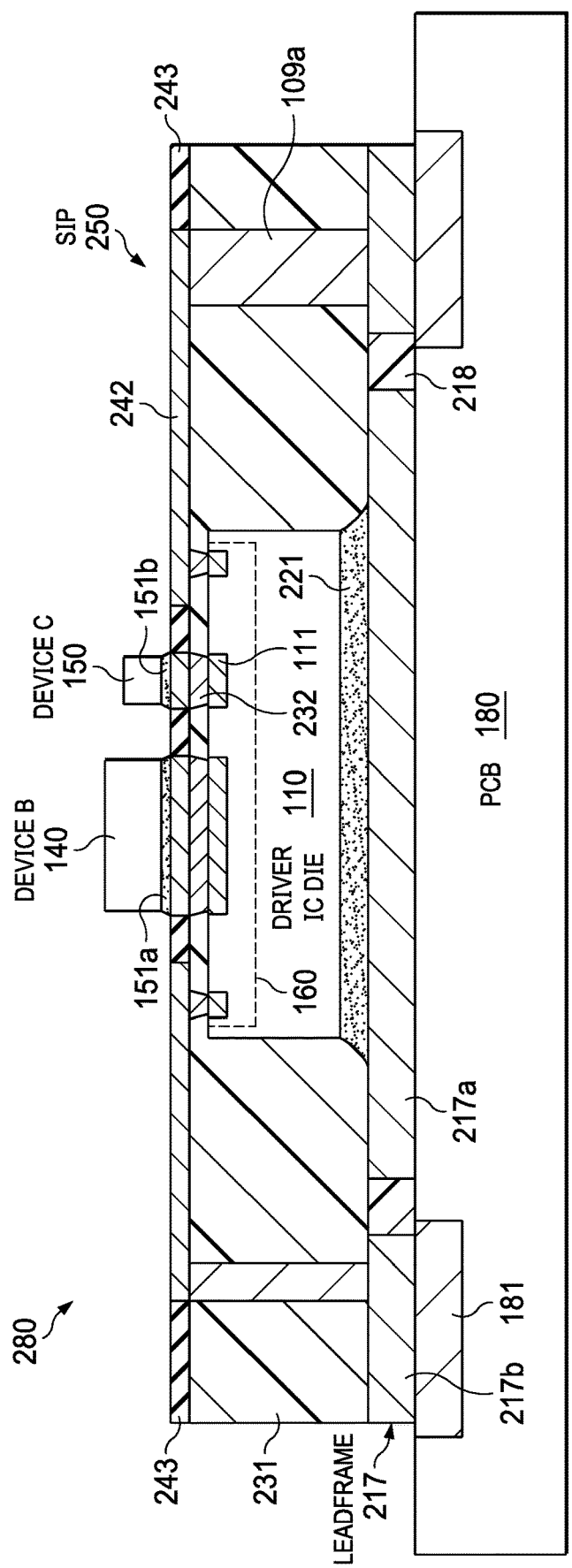
FIG. 2G shows the resulting SIP arrangement after assembling the SIP onto land pads of a PCB.

FIGS. 2A-2E show successive cross-sectional views corresponding to an example method for forming a disclosed SIP, with FIG. 2F showing the results after attaching device B 140 and device C 150 onto the driver IC die 110. FIG. 2G shows the results after assembling the SIP 250 shown in FIG. 2F onto a land pads 181 of a PCB 180.

FIG. 2A shows a pre-molded leadframe 217 comprising leadframe metal including a die pad 217a and a plurality of leads or lead terminals 217b, where the die pad 217a and the leads or lead terminals 217b are separated by a mold compound 218. This structure shown in FIG. 2A can generally be obtained commercially where the pre-molded leadframe 217 is shown on a support carrier 106. FIG. 2B shows the in-process SIP after die attaching a driver IC die 110 top side up using a die attachment material 221, and after plating to form metal posts (for example, comprising copper) shown as 109a onto the leads or lead terminals 217b on respective sides of the driver IC die 110.

FIG. 2C shows the in-process SIP after over molding to form a mold compound 231, and then backgrinding the mold compound 231 and metal posts 109a to a desired final thickness. As shown, there is some mold compound 231 over a top side of the driver IC die 110. FIG. 2D shows the in-process SIP after drilling to form apertures through a thickness of the mold compound 231 over the top side of the driver IC die 110, and after the drilling, forming metal (e.g., copper) in the apertures depicted in areas shown over bond pads 111 of driver IC die 110 to provide the bonding features 232 shown. The drilling can comprise laser drilling, chemical wet etching, or plasma etching.

FIG. 2E shows the in-process SIP after plating a patterned RDL 242 using a patterned dielectric layer 243, such as comprising a patterned solder mask layer, to contact the bonding features 232 and to contact the top side of the metal posts 109a. Although a single RDL 242 is shown, as known in the art there can be two or more RDL layers. FIG. 2F shows the SIP 250 after attaching a device B 140 and a device C 150. FIG. 2G shows the resulting SIP arrangement shown as 280 after assembling the SIP 250 onto land pads 181 of a PCB 180.

Figure 3:
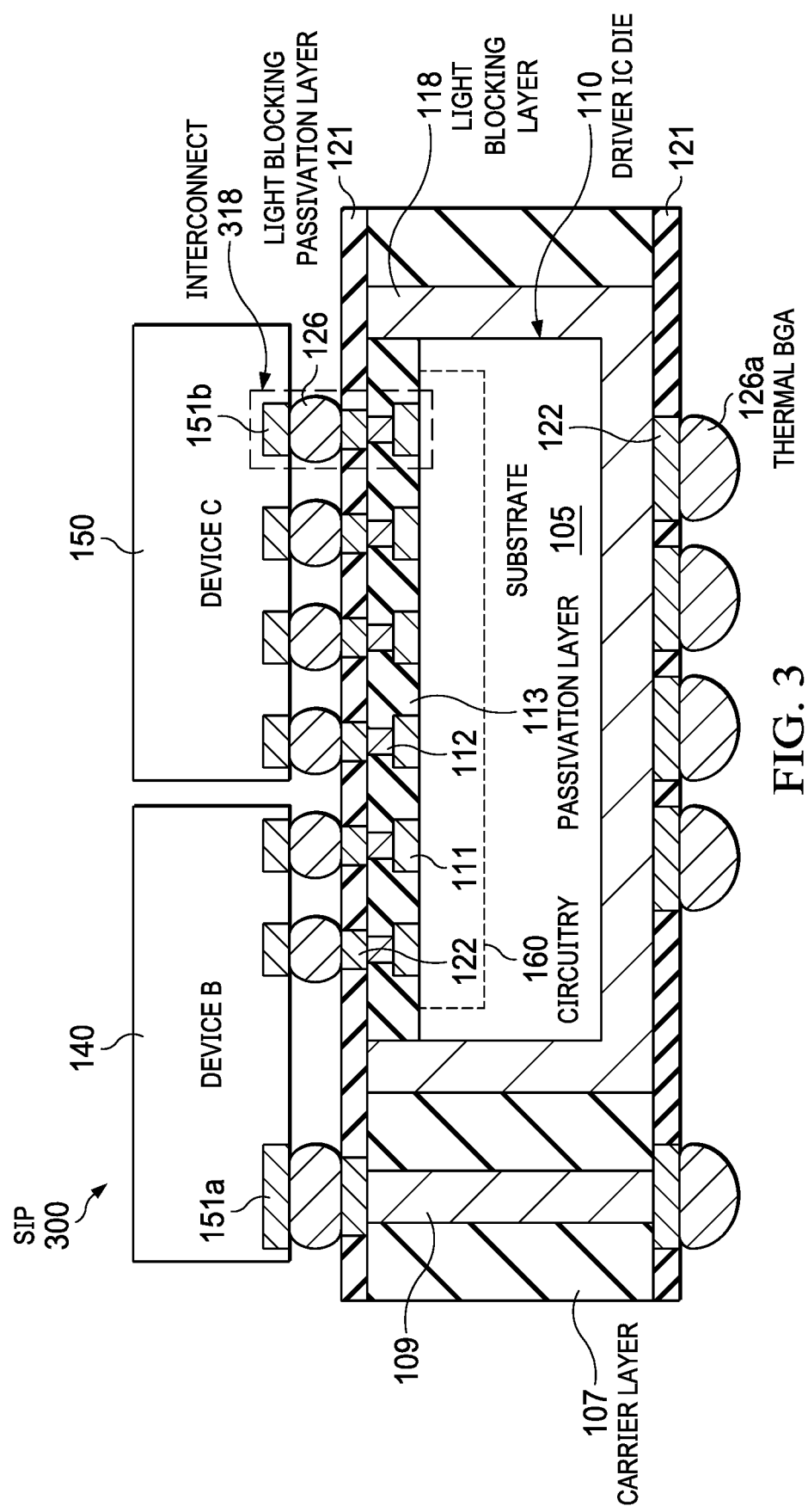
FIG. 3 shows a cross-sectional view of an example SIP.

FIG. 3 shows an example SIP 300. SIP 300 is related to the SIP 190 shown in FIG. 1J having device B 140 and device C 150 attached to a top side of driver IC die 110, where like SIP 190, SIP 300 for device B 140 and device C 150 both include bonding features 151a, 151b, respectively. SIP 300 shows for the connection between device C 150 and the driver IC die 110 including a disclosed a face-to-face interconnect identified as 318 that comprises the first bonding features 151b, solder balls 126, metal features 122, pillars 112, and bond pads 111. There is also an analogous face-to-face connection (not including a reference number in FIG. 3) between the device B 150 and the driver IC die 110.

Disclosed face-to-face interconnects are generally of a short length, typically being in the range of 5 µm to 200 µm in length, such as 5 µm to 25 µm in length provide a low inductance, and as noted above having an inductance that is generally 1 to 500 pH, and a low resistance that is generally <1 mOhm up to about 100 mOhm.

While SIP 190 has the light blocking layer 118, SIP 300 has a light blocking passivation layer 121, such as a prepreg layer, which can be light blocking due to a high loading (meaning at least one weight %) of an opaque material such as carbon black. Electrical coupling between the substrate 105 of driver IC die 110 which generally comprises doped silicon including the circuitry 160, and the light blocking layer 118 disclosed as generally being a metal that is thus electrically conductive such as comprising solder, is prevented because the substrate 105 will in operation generally be grounded. Accordingly, any coupling between the substrate 105 to the light blocking layer 118 will extend to ground. The solder features shown as 126a at the bottom of the driver IC die 110 that are shown unconnected to the circuitry 160 function as thermal ball grid array (BGA) features for dissipating heat during operation of the SIP 300. Analogous to what is shown in FIG. 1J, it is the light blocking passivation layer 121 above the driver IC die 110 is also shown on the bottom of the SIP 300.

Figure 4:
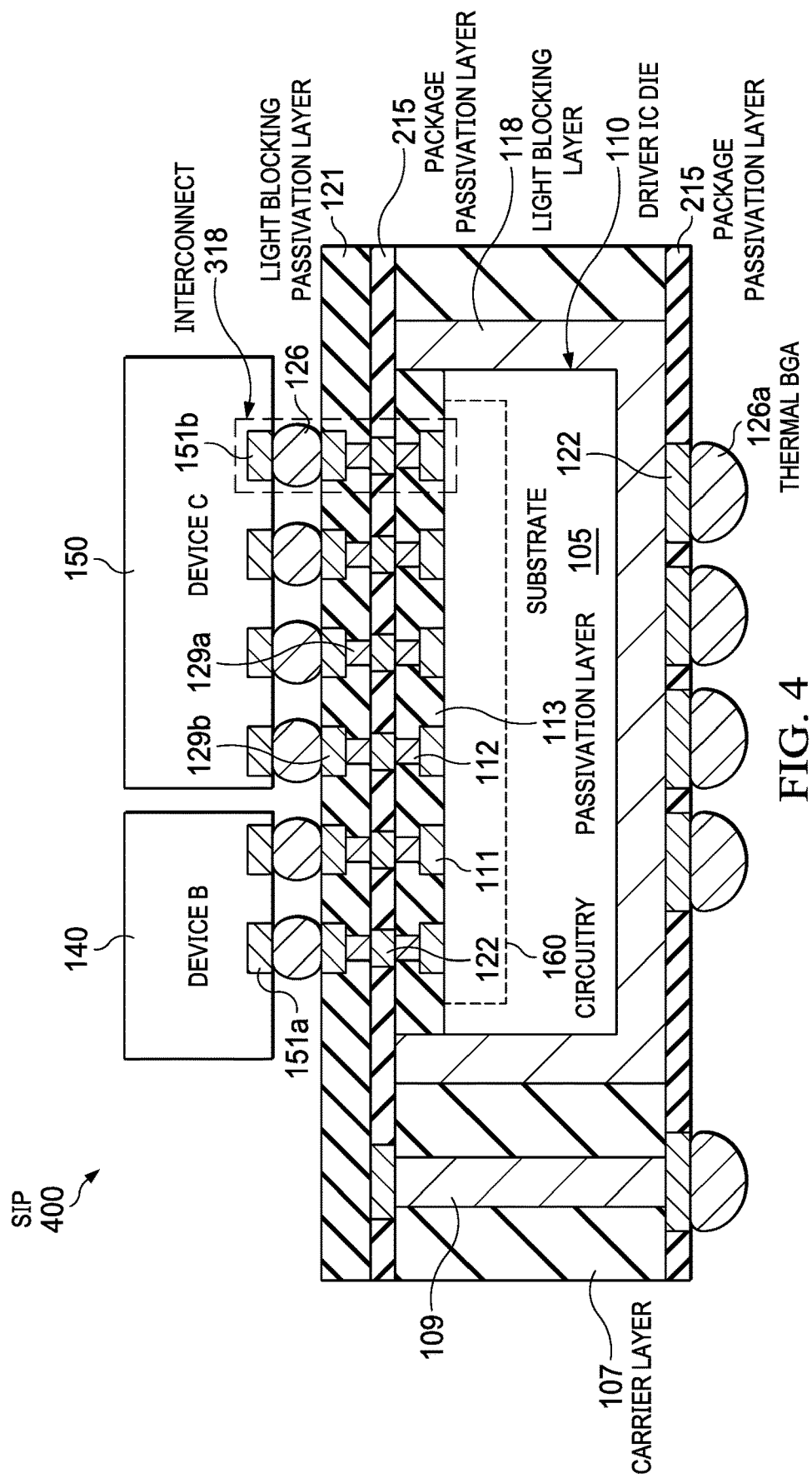
FIG. 4 shows a cross-sectional view of an example SIP.

FIG. 4 shows an example SIP 400 comprising an embedded die quad flat no-leads (QFN) package. SIP 400 differs from SIP 300 by including a package passivation layer 215 on both sides of the driver IC die 110, being on the first passivation layer 113 on the top side of driver IC die 110 that is on the light blocking layer 118. The package passivation layer 215 can comprise a prepreg layer. The SIP 400 also includes a light blocking passivation layer 121 which is generally formed as a buildup layer to include conductive features 129b on 129a that extend through a full thickness of light blocking passivation layer 121. Thus, for SIP 400, the light blocking passivation layer 121 is on top of the package passivation layer 215. Also, for SIP 400, although the package passivation layer 215 is generally not light blocking because light blocking is provided by the light blocking passivation layer 121. However, it is also possible for the package passivation layer 215 if it includes carbon loading to optionally also be light blocking.

Figure 5:
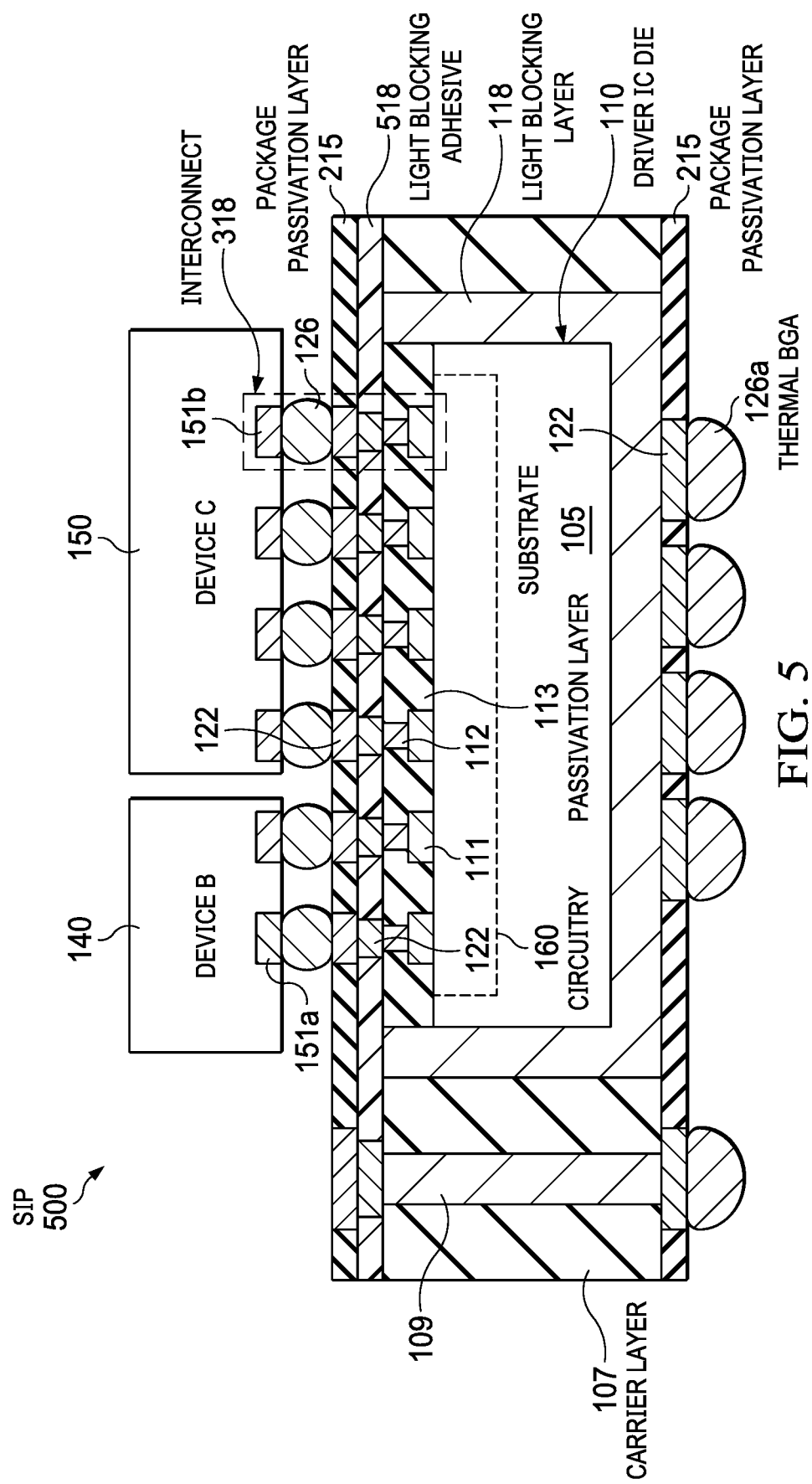
FIG. 5 shows a cross-sectional view of another example SIP.

FIG. 5 shows an example SIP 500. SIP 500 differs from SIP 400 by including a light blocking adhesive layer 518 which can comprise an epoxy or prepreg layer with a high carbon black content, generally at least 1 weight %, generally being 10 to 100 µm thick, positioned between the first passivation layer 113 and the package passivation layer 215 that may also be referred to as a second passivation layer. Thermal BGAs 126a are shown on a bottom side of the SIP 500.

Figure 6:
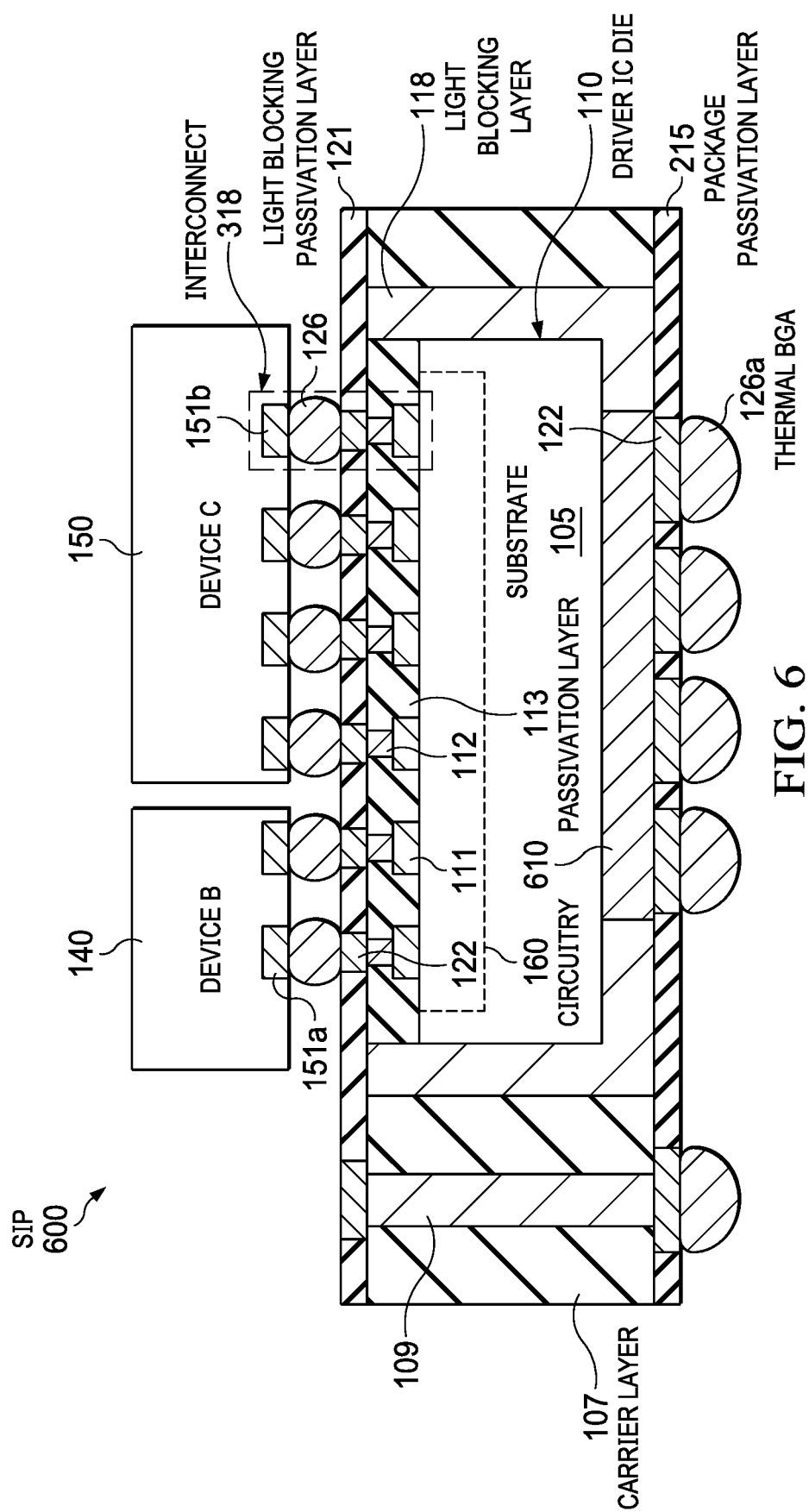
FIG. 6 shows a cross-sectional view of yet another example SIP.

FIG. 6 shows an example SIP 600. SIP 600 differs from SIP 400 shown in FIG. 4 by including a layer of backside metal 610 on the back side of the substrate 105 of the driver IC die 110.

EXAMPLES

Disclosed aspects are further illustrated by the following specific Examples, which should not be construed as limiting the scope or content of this Disclosure in any way. Experiments were performed using simulations to evaluate the thermal and electrical performance of a disclosed SIP having low inductance and low series resistance face-to-face interconnects between the driver IC die and device B and device C. The table below includes this evaluation data with a disclosed SIP shown as a reference SIP.

| Effective Resistance (° C./W) | Reference SIP | Disclosed SIP |
| --- | --- | --- |
| VCSEL to Die | 38.0 | 26.3 |
| Die to Pad | 4.1 | 0.4 |
| RthJA (Die) | 34.5 | 31.0 |

The reference SIP included a VCSEL corresponding to device B described above mounted on top of a conventional QFN package that includes a driver/controller IC die. An electrical connection between the VCSEL and a driver/controller IC die below for the reference SIP was established by a vias-in-mold arrangement. Although this reference SIP design is thermally superior as compared to a side-by-side SIP design, there still exists high thermal resistance between the VCSEL and the leadframe's die pad shown in the table as the 'Pad.' This high thermal resistance results from the thick mold compound between VCSEL and driver/controller IC die, the via structure and pattern that provides a limited conduction path for heat flow, and the die attach material which was a non-thermally conductive epoxy.

What is shown in the table above as a disclosed SIP was found to significantly reduce the thermal resistance by minimizing the mold thickness, replacing the via structure with solid copper pads, and the die attach material also comprised a comparatively high thermal conductivity sintered-silver die attach material. The total thermal resistance between the VCSEL and the die pad for the disclosed SIP was found to be reduced 37% from 42.1° C./W to 26.7° C./W, which enabled the VCSEL to dissipate 53% more power with the disclosed SIP as compared to the reference SIP.

Disclosed aspects can be integrated into a variety of assembly flows to form a variety of different SIP packages and related products. The SIP can comprise single semiconductor die or multiple semiconductor die, such as configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:
1. A system in a package (SIP), comprising:
carrier layer regions comprising a dielectric material with at least one metal post therethrough, adjacent ones of the carrier layer regions defining a gap having dimensions sufficient for placement of a driver integrated circuit (IC) die within the gap;
the driver IC die within the gap comprising a substrate having circuitry configured for a function with nodes connected to bond pads exposed by openings in a top side of a first passivation layer, wherein the driver IC die is positioned with the bond pads facing up;

a dielectric layer on the first passivation layer and on the carrier layer region including filled vias therethrough coupled to the bond pads and to the metal post;
a light blocking layer on sidewalls and on a bottom side of the substrate;
a first device including a light emitter for emitting light at a wavelength having first bondable features thereon; and
wherein the first bondable features are flipchip mounted comprising a solder connection to a first portion of the bond pads.

2. The SIP of claim 1, wherein the light blocking layer has a thermal conductivity at 20° C. of at least 10 W/m·K and blocks at least 90% of the light that is incident thereon.

3. The SIP of claim 1,
further comprising a second device having second bondable features positioned lateral to the first device,
wherein the second bondable features are flipchip mounted comprising the solder connection to a second portion of the bond pads.

4. The SIP of claim 1, further comprising a second passivation layer on the first passivation layer, and an additional light blocking passivation layer on the second passivation layer.

5. The SIP of claim 1, further comprising a light blocking adhesive layer on the first passivation layer and a second passivation layer on the light blocking adhesive layer.

6. The SIP of claim 1, further comprising a layer of backside metal on a back side of the driver IC die.

7. The SIP of claim 3, wherein the second device comprises a resistor, capacitor, or an inductor.

8. The SIP of claim 1, wherein the light emitter comprises a semiconductor laser or a light-emitting diode (LED), and wherein the wavelength is 500 nm to 2000 nm.

9. The SIP of claim 1, wherein the light blocking layer comprises a metal, a metal alloy, or a polymer including carbon loading at a loading level of at least 1 weight %.

10. The SIP of claim 1, wherein the dielectric layer includes carbon loading at a loading level of at least 1 weight % for light blocking.

11. A system in a package, comprising:
a leadframe including a die pad and a plurality of leads or lead terminals, where the die pad and the leads or lead terminals are separated by a mold compound;
a driver integrated circuit (IC) die on the die pad comprising a substrate having circuitry configured for a function with nodes connected to a plurality of bond pads including a first bond pad, wherein the driver IC die is positioned on the die pad with the plurality of bond pads facing up;
a patterned redistribution layer (RDL) over a top side of the driver IC die;
a mold compound on sides of the driver IC die having metal posts throughout its thickness attached to the leads or the lead terminals;
wherein the RDL includes a first portion over the first bond pad, and traces between some of the plurality of bond pads and the metal posts;
a first device including a light emitter for emitting light at a wavelength having first bondable features on the first portion of the RDL; and
wherein the RDL blocks at least 90% of the light that is incident thereon.

12. The SIP of claim 11, wherein the RDL has a thermal conductivity at 20° C. of at least 10 W/m·K and blocks at least 90% of the light that is incident thereon.

13. The SIP of claim 11,
further comprising a second device having second bondable features positioned lateral to the first device,
wherein the second bondable features are flipchip mounted comprising the solder connection to a second portion of the bond pads.

14. The SIP of claim 11, further comprising a layer of backside metal on a back side of the driver IC die.

15. The SIP of claim 13, wherein the second device comprises a resistor, capacitor, or an inductor.

16. The SIP of claim 11, wherein the light emitter comprises a semiconductor laser or a light-emitting diode (LED), and wherein the wavelength is 500 nm to 2000 nm.

17. The SIP of claim 11, wherein the RDL comprises a metal, a metal alloy, or a polymer including carbon loading at a loading level of at least 1 weight %.

18. The SIP of claim 11, wherein the RDL includes carbon loading at a loading level of at least 1 weight % for light blocking.

19. The SIP of claim 11, further including metal pillars on the bond pads.

20. A system in a package (SIP), comprising:
carrier layer regions comprising a dielectric material with at least one metal post therethrough, adjacent ones of the carrier layer regions defining a gap having dimensions sufficient for placement of a driver integrated circuit (IC) die within the gap;
the driver IC die within the gap comprising a substrate having circuitry configured for a function with nodes connected to bond pads exposed by openings in a top side of a first passivation layer, wherein the driver IC die is positioned with the bond pads facing up;
a dielectric layer on the first passivation layer and on the carrier layer region including filled vias therethrough coupled to the bond pads and to the metal post;
a light blocking layer on sidewalls and on a bottom side of the substrate at 20° C. of at least 10 W/m·K;
a first device including a light emitter for emitting light at a wavelength having first bondable features thereon;
wherein in the light blocking layer blocks at least 90% of the light that is incident thereon; and
wherein the first bondable features are flipchip mounted comprising a solder connection to a first portion of the bond pads.

* * * * *